(12) United States Patent
Maeda et al.

(10) Patent No.: US 6,343,209 B1
(45) Date of Patent: Jan. 29, 2002

(54) TUNER FOR DIGITAL AND ANALOG USE

(75) Inventors: Tatsuo Maeda, Izumi; Shigeto Masuda, Osaka, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/207,264

(22) Filed: Dec. 9, 1998

(30) Foreign Application Priority Data

Dec. 15, 1997 (JP) .............................................. 9-343530
Dec. 15, 1997 (JP) .............................................. 9-343531

(51) Int. Cl.[7] .................................................. H04B 1/26
(52) U.S. Cl. .................... 455/160.1; 455/300; 455/553; 348/731
(58) Field of Search .............................. 455/131, 182.1, 455/183.1, 160.1, 165.1, 296, 63, 190.1, 189.1, 191.1, 553, 313, 323, 318, 300, 301; 375/216; 348/558, 731

(56) References Cited

U.S. PATENT DOCUMENTS

| | | | |
|---|---|---|---|
| 4,592,093 A | * 5/1986 | Ouchi et al. | 455/190.1 |
| 4,703,520 A | * 10/1987 | Rozanski, Jr. et al. | 455/183.1 |
| 5,640,213 A | * 6/1997 | Mirahara et al. | 348/731 |
| 5,757,441 A | * 5/1998 | Lee et al. | 348/731 |
| 5,940,143 A | * 8/1999 | Igarashi et al. | 455/183.1 |
| 6,016,170 A | * 1/2000 | Takayama et al. | 348/731 |
| 6,057,889 A | * 5/2000 | Reitmeier et al. | 348/558 |

FOREIGN PATENT DOCUMENTS

| JP | 8289212 | | 11/1996 |
|---|---|---|---|
| TW | 87119956 | * | 11/1997 |

* cited by examiner

Primary Examiner—Lester G. Kincaid

(57) ABSTRACT

A tuner for both digital and analog use that can receive both digital broadcast and analog broadcast signals, includes a signal input terminal; a frequency conversion section which converts and inputted signal to an IF signal; and a switching/distributing section which, based on the type of received signal (analog/digital), switches a destination to which to send the IF signal or distributes the IF signal. There is also a down-converter section, that further converts the IF signal into a Low IF signal; a terminal for output of the IF signal. The aforementioned components are all contained in a single body that performs an electromagnetic seal function. Operation of the switching/distributing section and/or the down-converter section may be controlled by a control signal from a structural element within the body.

16 Claims, 10 Drawing Sheets

US 6,343,209 B1

1

TUNER FOR DIGITAL AND ANALOG USE

FIELD OF THE INVENTION

The present invention relates to a tuner for digital and analog use, for selectively receiving digital modulated television signals and analog modulated television signals.

BACKGROUND OF THE INVENTION

Recently, with the shift to digital television broadcasting, development of television receivers capable of receiving both analog and digital broadcasts has been pursued. In the United States, and other industrial nations, the digital modulation method which has been adopted for terrestrial broadcast television is 8VSB (8 Vestigial Sideband). Since 8VSB uses the same CH (channel) bandwidth as conventional analog broadcasting (NTSC: National Television System Committee), the conventional front end can be used in almost unchanged form.

FIG. 9 shows one example of a front-end system (from front end to demodulation circuits) which uses the double-conversion method, including a conventional tuner for digital and analog use. This conventional front-end system is made up of a frequency conversion section 100, a switch section 101, a down-converter section 102, an A/D conversion section 103, a VSB demodulation section 104, and an NTSC demodulation section 105. Further, in this conventional example, members from a signal input terminal 115, through the frequency conversion section 100, up to an IF (Intermediate Frequency) signal output terminal 130 are collectively referred to as a "tuner for digital and analog use."

The frequency conversion section 100 can be further divided into first and second conversion sections 106 and 107. The first conversion section 106 is made up of an RF amplifier 108, a first mixer 109, a BPF (Band-Pass Filter) 110, a first IF amplifier 111, a BPF 112, a first local oscillator 113, and a first PLL (Phase Locked Loop) circuit 114. Further, the first local oscillator 113 and the first PLL circuit 114 form a closed loop.

An input signal from the signal input terminal 115 first undergoes wideband amplification by the RF amplifier 108. Meanwhile, first PLL control data 116 is applied, via a terminal 117, to the first PLL circuit 114, and, by means of a signal from the first PLL circuit 114, the first local oscillator 113 produces a first local signal of a frequency specified by the first PLL control data 116. Then, in the first mixer 109, the output from the RF amplifier 108 and the first local signal produced by the first PLL circuit 114 and the first local oscillator 113 are mixed and up-converted into a first IF signal. The first IF signal, after undergoing band limiting in the BPF 110, is amplified by the first IF amplifier 111, and is then band limited by the BPF 112 and outputted to the second conversion section 107.

The second conversion section 107 is made up of a second mixer 118, a second IF amplifier 119, a BPF 120, a second local oscillator 121, and a second PLL circuit 122. Further, the second local oscillator 121 and the second PLL circuit 122 form a closed loop.

Second PLL control data 123 is applied, via a terminal 124, to the second PLL circuit 122, and, by means of a signal from the second PLL circuit 122, the second local oscillator 121 produces a second local signal of a frequency specified by the second PLL control data 123. Then, in the second mixer 118, the output from the BPF 112 of the first conversion section 106 and the second local signal produced by the second PLL circuit 122 and the second local oscillator 121 are mixed and down-converted into a second IF signal. The second IF signal is amplified by the second IF amplifier 119, and is then band limited by the BPF 120 and outputted to the IF signal output terminal 130.

The switch section 101, based on an external control signal 125 in accordance with the type of received signal (analog/digital), switches the destination to which to send the second IF signal from the IF signal output terminal 130. By means of the switching of the switch section 101, a second IF signal corresponding to a digital broadcast signal is sent, via a terminal 141, to the down-converter section 102. A second IF signal corresponding to an analog broadcast signal, on the other hand, is sent, via a terminal 142, directly to the NTSC demodulation section 105.

The down-converter section 102 is a signal conversion means which converts the second IF signal obtained via the switch section 101 (hereinafter referred to simply as the "IF signal") to a signal suitable for input to a digital processing system. The down-converter section 102 is made up of a BPF 126, a digital IF amplifier 127, a down-converter mixer 128, and a down-converter local oscillator 129.

An IF signal corresponding to a digital broadcast signal, obtained through the switch section 101, undergoes band limiting necessary for digital demodulation, in the BPF 126, and is then amplified by the digital IF amplifier 127. In the down-converter mixer 128, the IF signal from the digital IF amplifier 127 and a signal produced by the down-converter local oscillator 129 are mixed and down-converted. The down-converted IF signal is then outputted, as a Low IF signal, to the A/D conversion section 103.

The A/D conversion section 103 converts the Low IF signal from the down-converter section 102 into a digital signal. The VSB (Vestigial Sideband) demodulation section 104 performs VSB demodulation of the digital signal from the A/D conversion section 103, and outputs a transport stream signal.

The NTSC demodulation section 105, on the other hand, performs NTSC demodulation of an IF signal corresponding to an analog broadcast signal, obtained through the switch section 101.

However, in the foregoing conventional front-end system, the frequency conversion section 100, the signal input terminal 115, and the IF signal output terminal 130 were contained, as a tuner for digital and analog use, in a single body 131, and the other circuits (the down-converter section 102, the A/D conversion section 103, the VSB demodulation section 104, and the NTSC demodulation section 105) were provided together on a common board.

Further, in the foregoing front-end system with conventional tuner for digital and analog use, a single control signal 125 was used to control the operations of the switch section 101, the down-converter section 102, the A/D conversion section 103, the VSB demodulation section 104, and the NTSC demodulation section 105.

Accordingly, with the foregoing conventional art, when receiving a digital broadcast signal, the down-converter section 102 was susceptible to the influence of noise produced by the digital processing system following the A/D conversion section 103. This caused impairment of characteristics of the down-converter local oscillator 129 of the down-converter section 102, such as precision of the local oscillating frequency. Further, since the down-converter section 102 was not enclosed by a body, there were problems with unnecessary radiation produced thereby.

Moreover, the foregoing problems also arose in a conventional front-end system for digital and analog use in which a baseband demodulation section was provided as the foregoing signal conversion means. The following will explain this conventional front-end system. Here, members having the same structure and functions as those explained above will be given the same reference numbers, and explanation thereof will be omitted here.

As shown in FIG. 10, this conventional front-end system, which uses the double conversion method, is made up of a frequency conversion section 100, a switch section 101, a baseband demodulation section 150, an A/D conversion section 103, a VSB demodulation section 104, and an NTSC demodulation section 105. Here again, a signal input terminal 115, the frequency conversion section 100, and an IF signal output terminal 130 are collectively referred to as a "tuner for digital and analog use."

The switch section 101, based on an external control signal 125 in accordance with the type of received signal (analog/digital), switches the destination to which to send the IF signal from the IF signal output terminal 130. In the present front-end system, by means of the switching of the switch section 101, an IF signal corresponding to a digital broadcast signal is sent, via a terminal 141, to the base band demodulation section 150. An IF signal corresponding to an analog broadcast signal, on the other hand, is sent, via a terminal 142, directly to the NTSC demodulation section 105.

The baseband demodulation section 150 is made up of a BPF 151, a digital IF amplifier 152, an I signal demodulation mixer 153, a Q signal demodulation mixer 154, a 90° phase shifter 155, a baseband local oscillator 156, and a phase comparing mixer 157.

An IF signal corresponding to a digital broadcast signal that is, obtained via the switch section 101 from the tuner for digital and analog use in the previous stage, undergoes band limiting necessary for baseband demodulation, in the BPF 151. Then, after amplification in the digital IF amplifier 152, the IF signal is sent to the I signal demodulation mixer 153 and the Q signal demodulation mixer 154. A signal produced by the baseband local oscillator 156 is inputted directly into the I signal demodulation mixer 153. Accordingly, in the I signal demodulation mixer 153, this signal and the IF signal from the digital IF amplifier 152 are mixed, and an I signal is outputted. The foregoing signal produced by the baseband local oscillator 156 is inputted into the Q signal demodulation mixer 154 via the 90° phase shifter 155. Accordingly, in the Q signal demodulation mixer 154, a signal inputted from the 90° phase shifter and the IF signal from the digital IF amplifier 152 are mixed, and a Q signal is outputted.

Here, since the phase of the baseband local oscillator 156 and a pilot carrier included in the signal inputted from the digital amplifier 152 must match exactly, the I signal and the Q signal are inputted into the phase comparing mixer 157, which detects any phase error, and which controls the phase of the baseband local oscillator 156 on the basis of the detected result. Since only the I signal is used in VSB demodulation, the baseband demodulation section 150 outputs only the I signal to the A/D conversion section 103.

The A/D conversion section 103 converts the I signal from the baseband demodulation section 150 into a digital signal. The VSB demodulation section 104 performs VSB demodulation of the digital signal from the A/D conversion section 103, and outputs a transport stream signal. The NTSC demodulation section 105, on the other hand, performs NTSC demodulation of an IF signal corresponding to an analog broadcast signal, obtained through the switch section 101.

In this type of conventional front-end system, the frequency conversion section 100, the signal input terminal 115, and the IF signal output terminal 130 were contained, as a tuner for digital and analog use, in a single body 131, and the other circuits (the baseband demodulation section 150, the A/D conversion section 103, the VSB demodulation section 104, and the NTSC demodulation section 105) were provided together on a common board, and a single control signal 125 was used to control the operations of the switch section 101, the baseband demodulation section 150, the A/D conversion section 103, the VSB demodulation section 104, and the NTSC demodulation section 105.

Accordingly, in the same way as in the front-end system provided with the down-converter section 102 (see FIG. 9), when receiving a digital broadcast signal, the baseband demodulation section 150 was susceptible to the influence of noise produced by the digital processing system following the A/D conversion section 103. This caused impairment of characteristics of the baseband local oscillator 156 of the baseband demodulation section 150, such as precision of the local oscillating frequency. Further, since the baseband demodulation section 150 was not enclosed by a body, there were problems due to the production of unnecessary radiation.

SUMMARY OF THE INVENTION

It is an object of the present invention to provide a tuner for digital and analog use which is able to reduce the influence of noise from a digital processing system on a signal conversion section made of a down-converter section, a baseband demodulation section, etc., and which is able to reduce unnecessary radiation from the signal processing section.

In order to attain the foregoing object, a tuner for digital and analog use according to the present invention is a tuner for receiving both digital broadcast signals and analog broadcast signals, and includes: a frequency conversion section, which converts a received signal to an intermediate-frequency signal; a destination determining section, which determines a destination to which to send the intermediate-frequency signal from the frequency conversion section; a signal conversion section, which converts the intermediate-frequency signal obtained through the destination determining section to a signal suitable for input to an external digital processing system; and a body, which contains the frequency conversion section, the destination determining section, and the signal conversion section.

With the foregoing structure, since the frequency conversion section, the destination determining section, and the signal conversion section are contained in a single body, the tuner for digital and analog use and the external digital processing system can be sufficiently electrically isolated from one another. Thus, a tuner for digital and analog use can be realized which is less susceptible to noise from the digital processing system, and thus it is possible to avoid impairment of the characteristics of the signal conversion section by that noise. Further, by enclosing the signal conversion section in the body, it is isolated from the digital processing system, and thus it is possible to reduce unnecessary radiation from the signal processing section.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE EMBODIMENTS

Figure 1:
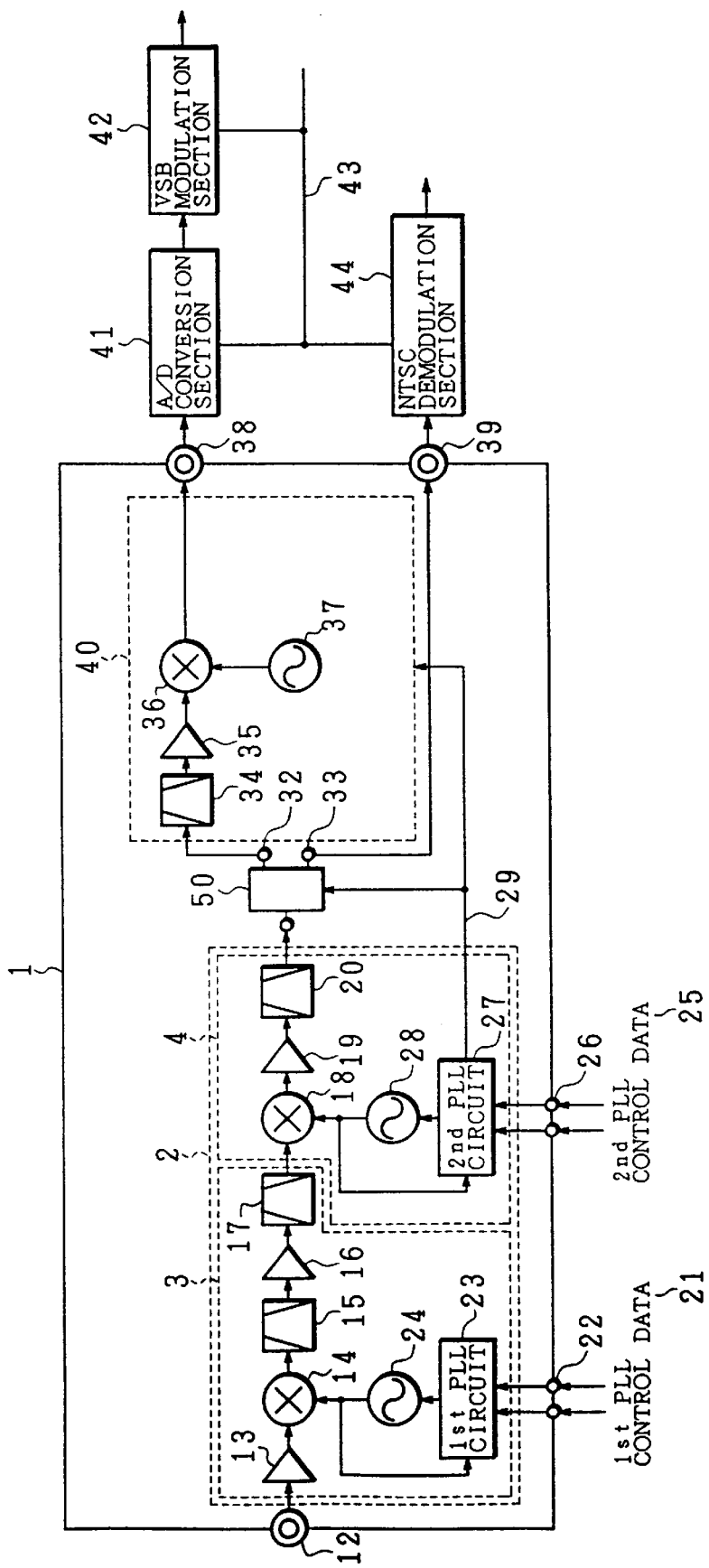
FIG. 1 is a block diagram schematically showing the structure of a tuner for digital and analog use according to an embodiment of the present invention, including a switching/distributing section which determines a destination to which to send an IF signal, and a down-converter section, and the structure of a front-end system for digital and analog use incorporating the foregoing tuner for digital and analog use.
Figure 2:
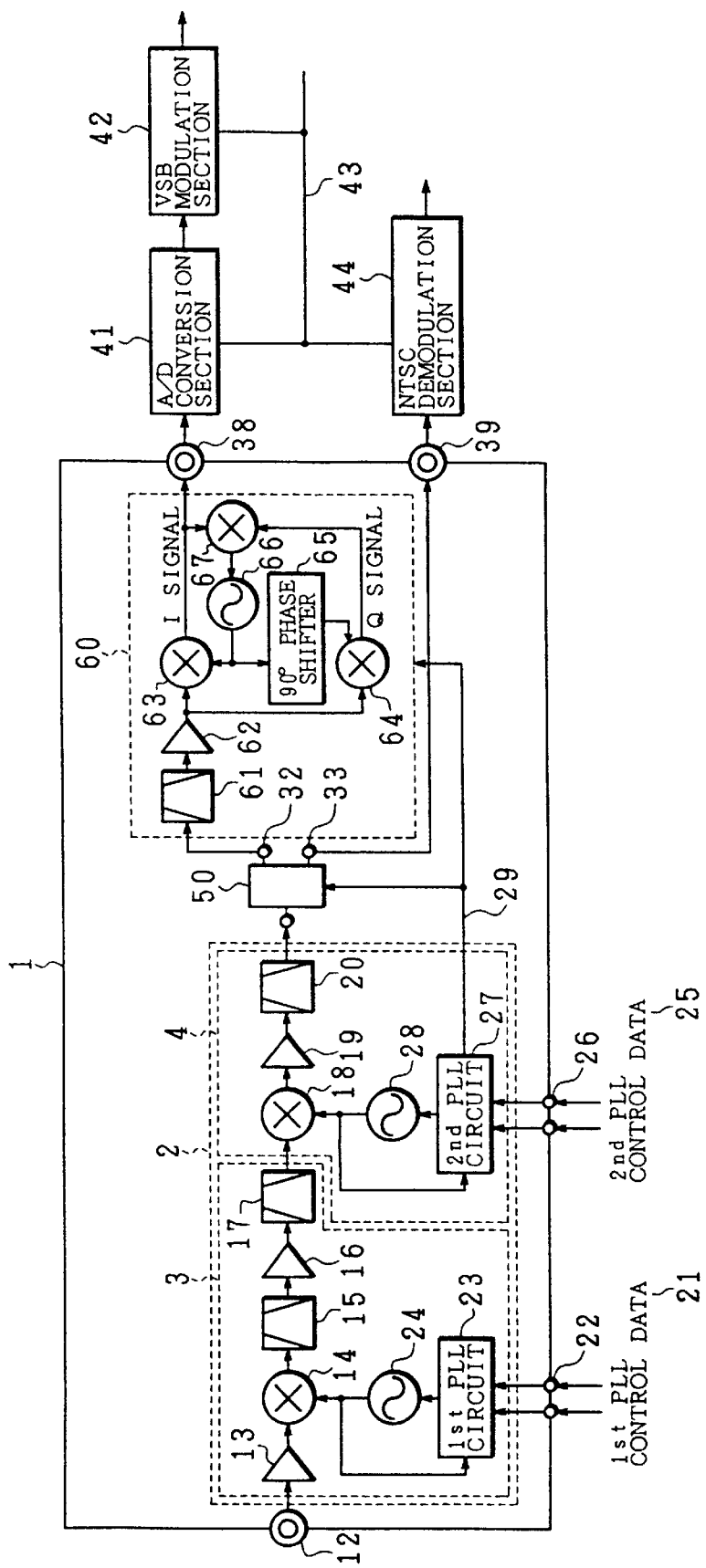
FIG. 2 is a block diagram schematically showing the structure of the foregoing tuner for digital and analog use, in which the foregoing down-converter section is replaced by a baseband demodulation section, and the structure of a front-end system for digital and analog use incorporating the foregoing tuner for digital and analog use.

The following will explain a first embodiment of the present invention with reference to FIGS. 1 and 2.

FIG. 1 is a circuit block diagram showing a front-end system (from front end to demodulation circuits) for digital and analog use, including the circuits of a tuner for digital and analog use according to an embodiment of the present invention. In FIG. 1, the front-end system for digital and analog use is one which adopts the double-conversion method, and is made up of a frequency conversion section 2 (frequency conversion means), a switching/distributing section 50 (destination determining means), a down-converter section 40 (signal conversion means), an A/D conversion section 41, a VSB demodulation section 42, and an NTSC demodulation section 44. The A/D conversion section 41, the VSB demodulation section 42, and a separation section and a decoder (not shown) make up a digital processing system, and the NTSC demodulation section 44 makes up an analog processing section. Further, the digital processing system and the analog processing section make up a demodulation processing section.

The frequency conversion section 2 converts an input signal (digital broadcast signal/analog broadcast signal) into an IF signal (intermediate-frequency signal). The switching/distributing section 50 determines a destination to which to send the IF signal. Specifically, the switching/distributing section 50 switches the destination to which to send the IF signal according to the type of received signal, or distributes the IF signal to terminals 32 and 33. The down-converter section 40 converts the IF signal obtained from the frequency conversion section 2 via the switching/distributing section 50 into a signal suitable for inputting into the digital processing system, by down-converting the foregoing IF signal into a Low IF signal. The operations of the A/D conversion section 41, the VSB demodulation section 42, and the NTSC demodulation section 44 are controlled by a common control signal 43 from outside a body 1 shown in FIG. 1; the details thereof will be discussed later.

In the present invention, the circuits within the area surrounded by the body 1, i.e., a signal input terminal 12, the frequency conversion section 2, the switching/distributing section 50, the down-converter section 40, an output terminal 38, and an IF signal output terminal 39, will be defined as the "tuner for digital and analog use," and will be referred to as such hereinafter.

The tuner for digital and analog use according to the present invention is a tuner for receiving both digital broadcast signals and analog broadcast signals, and its distinctive features are as described below.

(1) The tuner for digital and analog use comprises the signal input terminal 12, the frequency conversion section 2, the switching/distributing section 50, the down-converter section 40, the output terminal 38, and the IF signal output terminal 39.

(2) The foregoing structural elements (signal input terminal 12, frequency conversion section 2, switching/distributing section 50, down-converter section 40, output terminal 38, IF signal output terminal 39) are contained in a single body 1 which performs an electromagnetic seal function.

(3) Operation of the switching/distributing section 50 and/or the down-converter section 40 is controlled by a control signal from a structural element within the body 1. FIG. 1 shows, as one example of a control signal from a structural element within the body 1, a structure whereby operation of the switching/distributing section 50 and/or the down-converter section 40 is controlled by a control voltage 29 from a second PLL circuit 27 of the frequency conversion section 2. Incidentally, as another example of a control signal from a structural element within the body 1, a control voltage from a first PLL circuit 23 of the frequency conversion section 2 could also be used.

The following will explain the detailed structure of the front-end system for digital and analog use shown in FIG. 1.

The frequency conversion section 2 can be further divided into first and second conversion sections 3 and 4. The first conversion section 3 is made up of an RF amplifier 13, a first mixer 14, a BPF (Band-Pass Filter) 15, a first IF amplifier 16, a BPF 17, a first PLL (Phase Locked Loop) circuit 23, and a first local oscillator 24. The first PLL circuit 23 and the first local oscillator 24 form a closed loop.

An input signal from the signal input terminal 12 (500 MHz, for example) first undergoes wideband amplification by the RF amplifier 13. Meanwhile, first PLL control data 21 is applied, via an input terminal 22, to the first PLL circuit 23, and, by means of a signal from the first PLL circuit 23, the first local oscillator 24 produces a first local signal of a frequency specified by the first PLL control data 21. Then, in the first mixer 14, the output from the RF amplifier 13 and the first local signal produced by the first PLL circuit 23 and the first local oscillator 24 are mixed and up-converted into a first IF signal. For example, the first IF signal is 945.75 MHz. The first IF signal, after undergoing band limiting in the BPF 15, is amplified by the first IF amplifier 16, and is then band limited by the BPF 17 and outputted to the second conversion section 4.

The second conversion section 4 is made up of a second mixer 18, a second IF amplifier 19, a BPF 20, a second PLL circuit 27, and a second local oscillator 28. The second PLL circuit 27 and the second local oscillator 28 form a closed loop.

Second PLL control data 25 is applied, via an input terminal 26, to the second PLL circuit 27, and, by means of a signal from the second PLL circuit 27, the second local oscillator 28 produces a second local signal of a frequency specified by the second PLL control data 25. Then, in the second mixer 18, the output from the BPF 17 of the first conversion section 3 and the second local signal produced by the second PLL circuit 27 and the second local oscillator 28 are mixed and down-converted into a second IF signal. For example, the second IF signal is 45.75 MHz. The second IF signal is amplified by the second IF amplifier 19, and is then band limited by the BPF 20 and outputted to the switching/distributing section 50.

The switching/distributing section 50 is made of a switch section, a distributor section, etc. When made of a switch section, complete switching of the destination of the IF signal can be realized. A distributor section, in contrast, merely distributes the IF signal to two terminals 32 and 33, but complete switching of the destination of the IF signal can be realized in combination with shutoff of operation of the down-converter section 40. In other words, during receiving of analog broadcast signals, operation of the down-converter 40 is stopped, and the IF signal is sent through the terminals 32 and 33.

If the first and second IF signals are fixed at 945.75 MHz and 45.75 MHz, respectively, when the received signal (input signal) is 500 MHz, for example, the first local signal is 1445.75 MHz and the first IF signal 945.75 MHz, and the second local signal is 900 MHz and the second IF signal 45.75 MHz. Again, when the received signal (input signal) is 700 MHz, for example, the first local signal is 1645.75 MHz and the first IF signal 945.75 MHz, and the second local signal is 900 MHz and the second IF signal 45.75 MHz.

In FIG. 1, as one example of a control signal from a structural element within the body 1, a control voltage 29 from the second PLL circuit 27 of the frequency conversion section 2 is used to control operation of the switching/distributing section 50 and/or the down-converter section 40. Accordingly, digital broadcast signals are sent, by means of the switching of the switching/distributing section 50, through the terminal 32 to the down-converter section 40. Analog broadcast signals, on the other hand, are sent, by means of the switching of the switching/distributing section 50, through the terminal 33 and the IF signal output terminal 39, directly to the NTSC demodulation section 44.

The down-converter section 40 is made up of a BPF 34, a digital IF amplifier 35, a down-converter mixer 36, and a down-converter local oscillator 37.

An IF signal corresponding to a digital broadcast signal, obtained through the switching/distributing section 50, undergoes band limiting necessary for digital demodulation, in the BPF 34, and is then amplified by the digital IF amplifier 35. In the down-converter mixer 36, the IF signal from the digital IF amplifier 35 and a signal produced by the down-converter local oscillator 37 are mixed and down-converted. The down-converted IF signal is then outputted, as a Low IF signal, through the output terminal 38 to the A/D conversion section 41.

The A/D conversion section 41 converts the Low IF signal from the down-converter section 40 into a digital signal. The VSB demodulation section 42 performs VSB demodulation of the digital signal from the A/D conversion section 41, and outputs a transport stream signal. The VSB transport stream signal is a data stream encoded according to MPEG (Moving Picture Experts Group) 2. After VSB demodulation, the transport stream signal is separated into the respective signals in a separation section, decoded by a decoder, and turned into video signals, audio signals, etc. This type of processing section is generally referred to as an MPEG processing section. The NTSC demodulation section 44, on the other hand, performs NTSC demodulation of an IF signal corresponding to an analog broadcast signal, obtained through the switching/distributing section 50.

Next, FIG. 2 is a block diagram of a front-end system for digital and analog use in which the signal conversion means comprise a baseband demodulation section 60 instead of the down-converter section 40 shown in FIG. 1.

The baseband demodulation section 60 is made up of a BPF 61, a digital IF amplifier 62, an I signal demodulation mixer 63, a Q signal demodulation mixer 64, a 90° phase shifter 65, a baseband local oscillator 66, and a phase comparing mixer 67.

An IF signal corresponding to a digital broadcast signal, obtained, via the switching/distributing section 50, from the frequency conversion section 2, undergoes band limiting necessary for baseband demodulation, in the BPF 61. Then, after amplification in the digital IF amplifier 62, the IF signal is sent to the I signal demodulation mixer 63 and the Q signal demodulation mixer 64. A signal produced by the baseband local oscillator 66 is inputted directly into the I signal demodulation mixer 63. Accordingly, in the I signal demodulation mixer 63, this signal and the IF signal from the digital IF amplifier 62 are mixed, and an I signal is outputted. The foregoing signal produced by the baseband local oscillator 66 is inputted into the Q signal demodulation mixer 64 via the 90° phase shifter 65. Accordingly, in the Q signal demodulation mixer 64, a signal inputted from the 90° phase shifter and the IF signal from the digital IF amplifier 62 are mixed, and a Q signal is outputted.

Here, since the phase of the baseband local oscillator 66 and a pilot carrier included in the signal inputted from the digital amplifier 62 must match exactly, the I signal and the Q signal are inputted into the phase comparing mixer 67, which detects any phase error, and controls the phase of the baseband local oscillator 66 on the basis of the detected result. Since only the I signal is used in VSB demodulation, the baseband demodulation section 60 outputs only the I signal to the A/D conversion section 41.

Operations of the A/D conversion section 41, the VSB demodulation section 42, and the NTSC demodulation section 105 are the same as when the signal conversion means comprise the down-converter section 40.

As discussed above, in the front-end system for digital and analog use according to the present invention, the frequency conversion section 2, the switching/distributing section 50, and the signal conversion means (the down-converter section 40 or the baseband demodulation section 60) are contained in a single body 1 which performs an electromagnetic seal function. The body 1 is provided with the signal input terminal 12, the IF signal output terminal 39, the output terminal 38, the input terminal 22 for the first PLL control data, and the input terminal 26 for the second PLL control data. By means of the body 1, the tuner for digital and analog use (up to and including the signal conversion means) can be completely separated from the digital processing system (following the A/D conversion section 41).

Further, the present invention adopts a structure in which switching of the destination of the IF signal by the switching/distributing section 50 and/or switching of the signal conversion means ON or OFF are controlled by a control signal (in the present embodiment, the control voltage 29) from a structural element within the body 1 (in the present embodiment, the second PLL circuit 27), which differs from a control signal 43 of the digital processing system following the A/D conversion section 41.

Accordingly, during reception of a digital broadcast signal, the tuner for digital and analog use and the digital processing system can be sufficiently electrically isolated from each other, and a tuner for digital and analog use can be realized which is less susceptible to noise from the digital processing system.

Additionally, since the down-converter section 40 or the baseband demodulation section 60 is contained in the body 1 which performs an electromagnetic seal function, unnecessary radiation from the down-converter local oscillator 37 or the baseband local oscillator 66 can be held to a minimum.

Further, in the present embodiment, since the down-converter section 40 or the baseband demodulation section 60 is controlled by a control voltage 29 from the frequency conversion section 2, during reception of an analog broadcast signal, for example, operation of the down-converter section 40 or the baseband demodulation section 60 can be turned off. Consequently, during reception of an analog broadcast signal, the signal conversion means and the NTSC demodulation section 44 can be sufficiently isolated from each other, thus avoiding obstruction of NTSC demodulation operations by operation of the signal conversion means.

Figure 3:
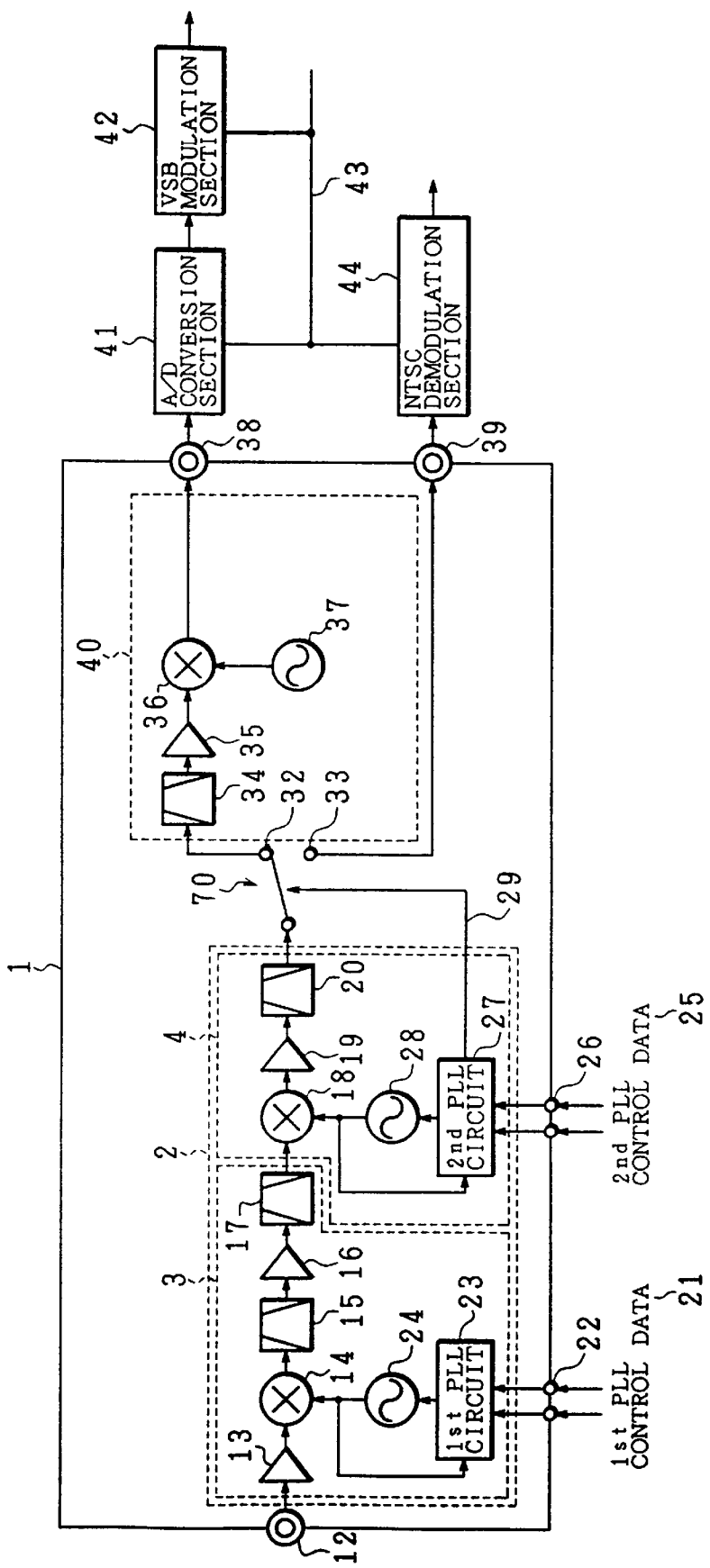
FIG. 3 is a block diagram schematically showing the structure of a tuner for digital and analog use according to another embodiment of the present invention, in which the foregoing switching/distributing section is made of a switch section, and the structure of a front-end system for digital and analog use incorporating the foregoing tuner for digital and analog use.
Figure 4:
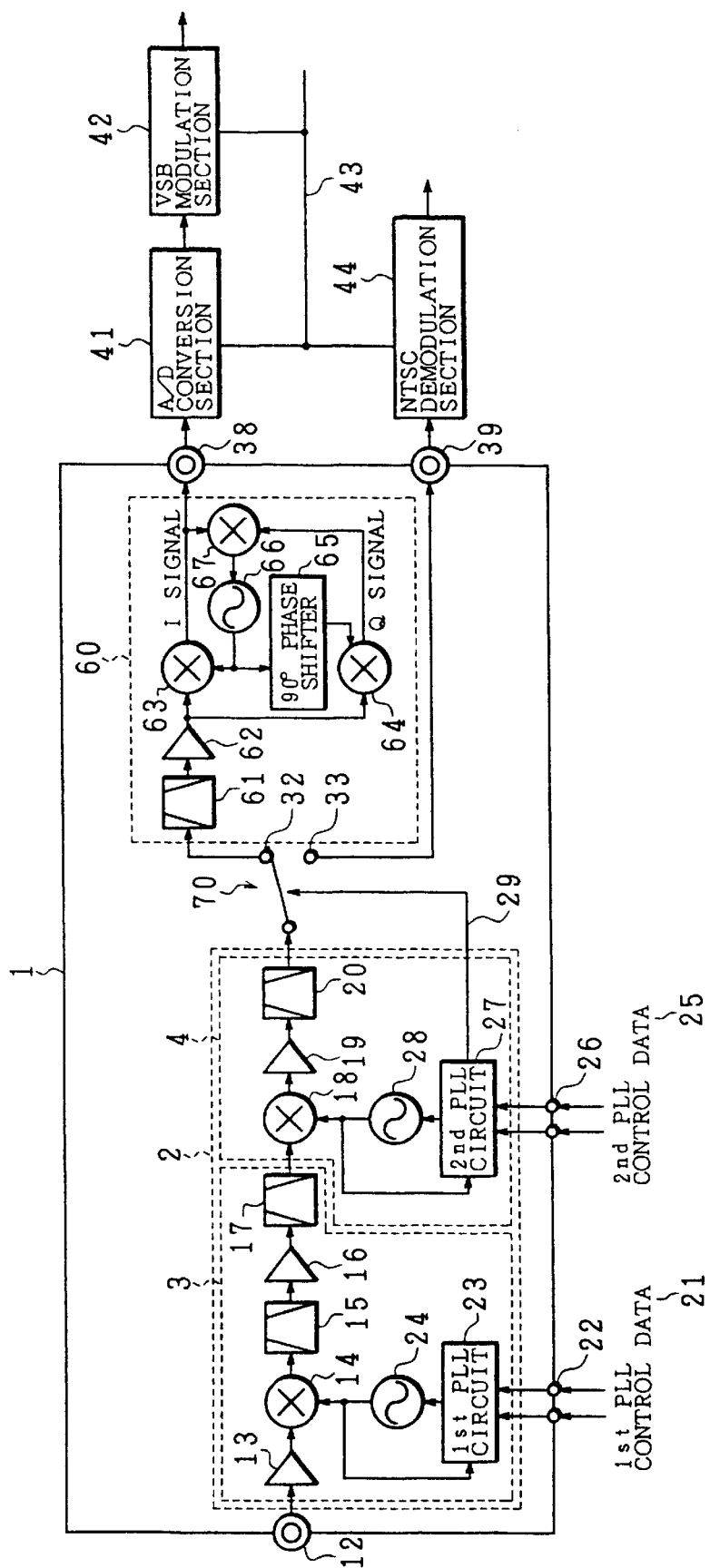
FIG. 4 is a block diagram schematically showing the structure of the foregoing tuner for digital and analog use, in which the foregoing down-converter section is replaced by a baseband demodulation section, and the structure of a front-end system for digital and analog use incorporating the foregoing tuner for digital and analog use.

The following will explain a second embodiment of the present invention with reference to FIGS. 3 and 4. For ease of explanation, structural elements equivalent to those of the first embodiment above will be given the same reference numbers, and explanation thereof will be omitted here.

The tuner for digital and analog use according to the present embodiment is equivalent to that of the first embodiment above, except that, as shown in FIGS. 3 and 4, the switching/distributing section 50 (see FIG. 1) is made of a switch section 70, and the control voltage 29 from the second PLL circuit 27 only controls operation of the switch section 70. Accordingly, in the present embodiment, the control voltage 29 does not control ON/OFF operations of the signal conversion means (the down-converter section 40 or the baseband demodulation section 60).

In the present embodiment, by use of the switch section 70, complete switching of the destination of the digital/analog broadcast signal can be realized. Further, with this structure, during reception of an analog broadcast signal, it is not necessary to turn off operation of the signal conversion means (the down-converter section 40 or the baseband demodulation section 60), as it is when a distributor is used. Accordingly, control of operation of the signal conversion means need not be performed, and the structure of the tuner for digital and analog use can be simplified.

Figure 5:
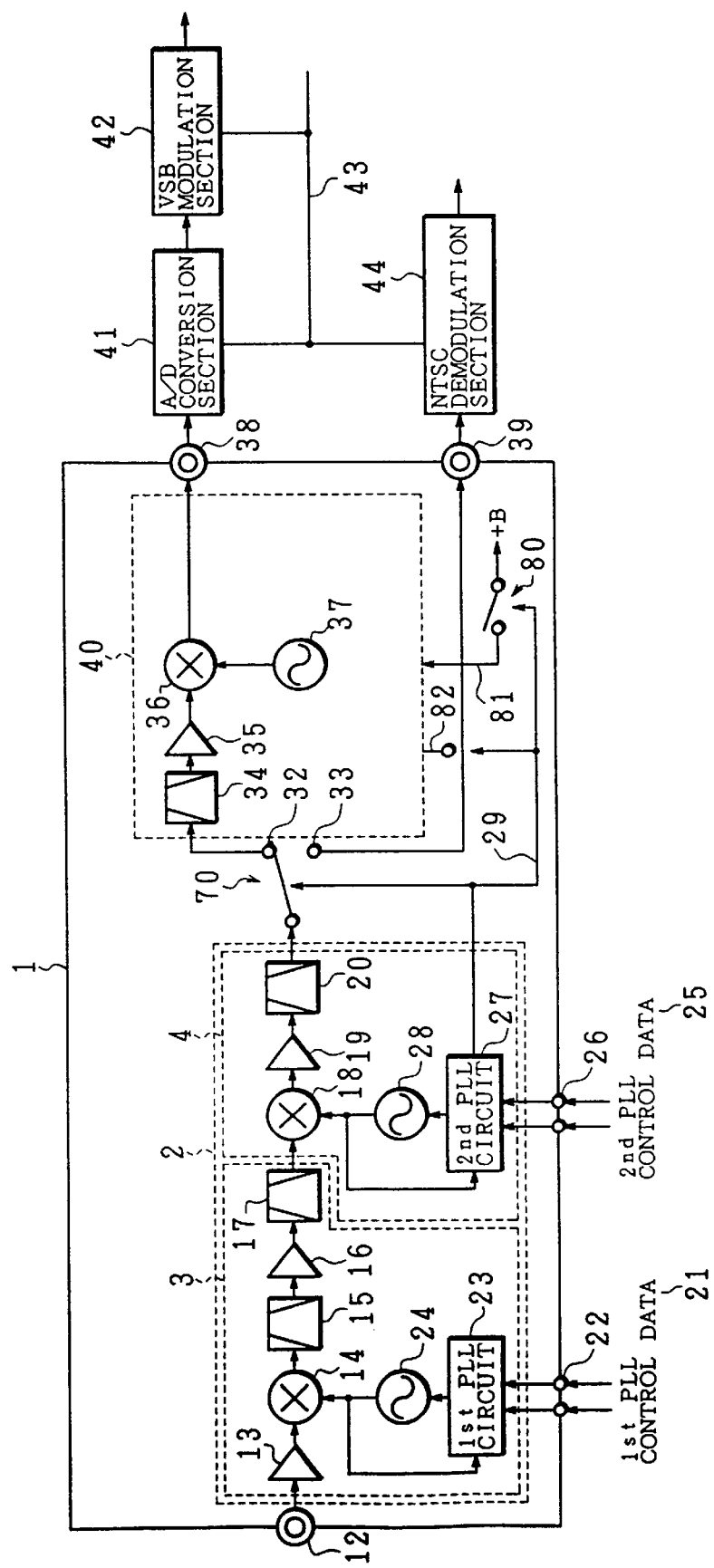
FIG. 5 is a block diagram schematically showing the structure of a tuner for digital and analog use according to a further embodiment of the present invention, in which the foregoing switching/distributing section is made of a switch section, and which includes another switch section for controlling power supply to a down-converter section, and the structure of a front-end system for digital and analog use incorporating the foregoing tuner for digital and analog use.
Figure 6:
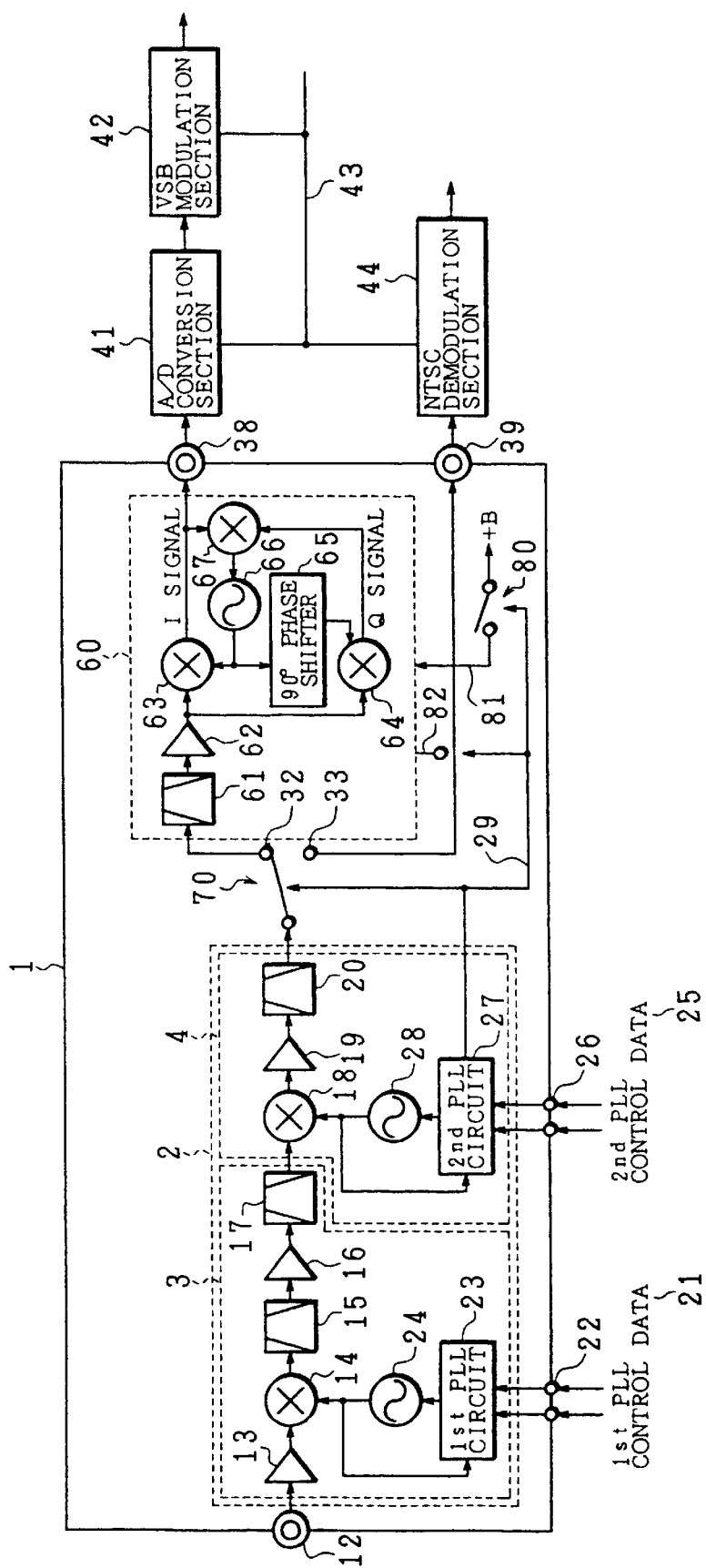
FIG. 6 is a block diagram schematically showing the structure of the foregoing tuner for digital and analog use, in which the foregoing down-converter section is replaced by a baseband demodulation section, and the structure of a front-end system for digital and analog use incorporating the foregoing tuner for digital and analog use.

The following will explain a third embodiment of the present invention with reference to FIGS. 5 and 6. For ease of explanation, structural elements equivalent to those of the first or second embodiment above will be given the same reference numbers, and explanation thereof will be omitted here.

The tuner for digital and analog use according to the present embodiment is equivalent to that of the second embodiment above, except that, as shown in FIGS. 5 and 6, a power line 81, provided with a switch circuit 80, is provided to supply power to the down-converter section 40 or the baseband demodulation section 60, and power supply thereto is controlled by the control voltage 29. Further, during reception of an analog broadcast signal, the control voltage 29 from the second PLL circuit 27 of the frequency conversion section 2, which controls the switch section 70, is used to turn the switch circuit 80 off, thus stopping power supply to the signal conversion means.

Thus, since operation of the signal conversion means can be turned off with certainty during reception of an analog broadcast signal, adverse effects of operation of the signal conversion means on the NTSC demodulation section 44 can be held to a minimum with certainty. Additionally, since power supply to the signal conversion means is stopped during reception of an analog broadcast signal, unnecessary power consumption can be held to a minimum.

Incidentally, in consideration of adverse effects on the NTSC demodulation section 44 during reception of an analog broadcast signal, a structure may be used which is capable of stopping power supply only to members (such as the oscillator circuit) chiefly responsible for the adverse effects. Thus it is not necessarily necessary to control the total power supply to the signal conversion means.

Further, in the present embodiment, the down-converter section 40 and the baseband demodulation section 60 are provided with an operation shutoff terminal 82. During reception of an analog broadcast signal, the second PLL circuit 27, as necessary, supplies to the operation shutoff terminal 82 an OFF signal (the control voltage 29), thus turning off at least part of the operation of the signal conversion means.

The operation shutoff terminal 82 is of a type generally called an enable terminal or a shut-down terminal, and, when the signal conversion means are realized in an IC, some or all of the functions of the signal conversion means are turned off or put in a waiting state by supply of the OFF signal.

By means of this structure, during reception of an analog broadcast signal, obstruction of operations of the NTSC demodulation section 44 by the signal conversion means can be held to a minimum with certainty.

In other words, in the present embodiment, by adopting, during reception of an analog broadcast signal, both (1) a structure to turn off the switch circuit 80, and (2) a structure for supplying to the operation shutoff terminal 82 an OFF signal, adverse effects of the signal conversion means on the NTSC demodulation section 44 during reception of an analog broadcast signal can be held to a minimum with certainty.

Moreover, it is of course possible to use a structure which provides only one of the foregoing (1) and (2).

Incidentally, in the drawings, the "+B" shown at the switch circuit 80 indicates power supplied to a semiconductor, such as an IC.

Figure 7:
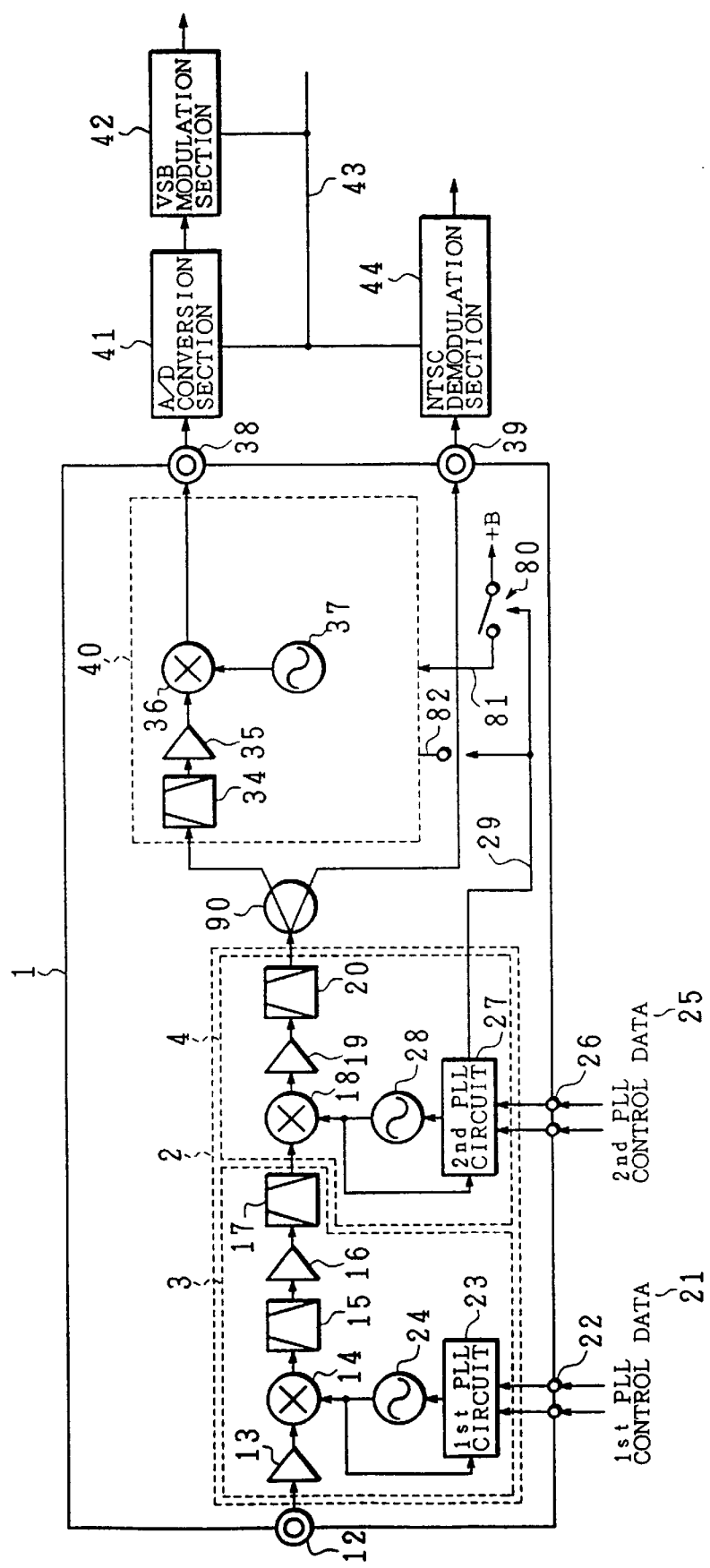
FIG. 7 is a block diagram schematically showing the structure of a tuner for digital and analog use according to a further embodiment of the present invention, in which the foregoing switching/distributing section is made of a distributor section, and which includes another switch section for controlling power supply to a down-converter section, and the structure of a front-end system for digital and analog use incorporating the foregoing tuner for digital and analog use.
Figure 8:
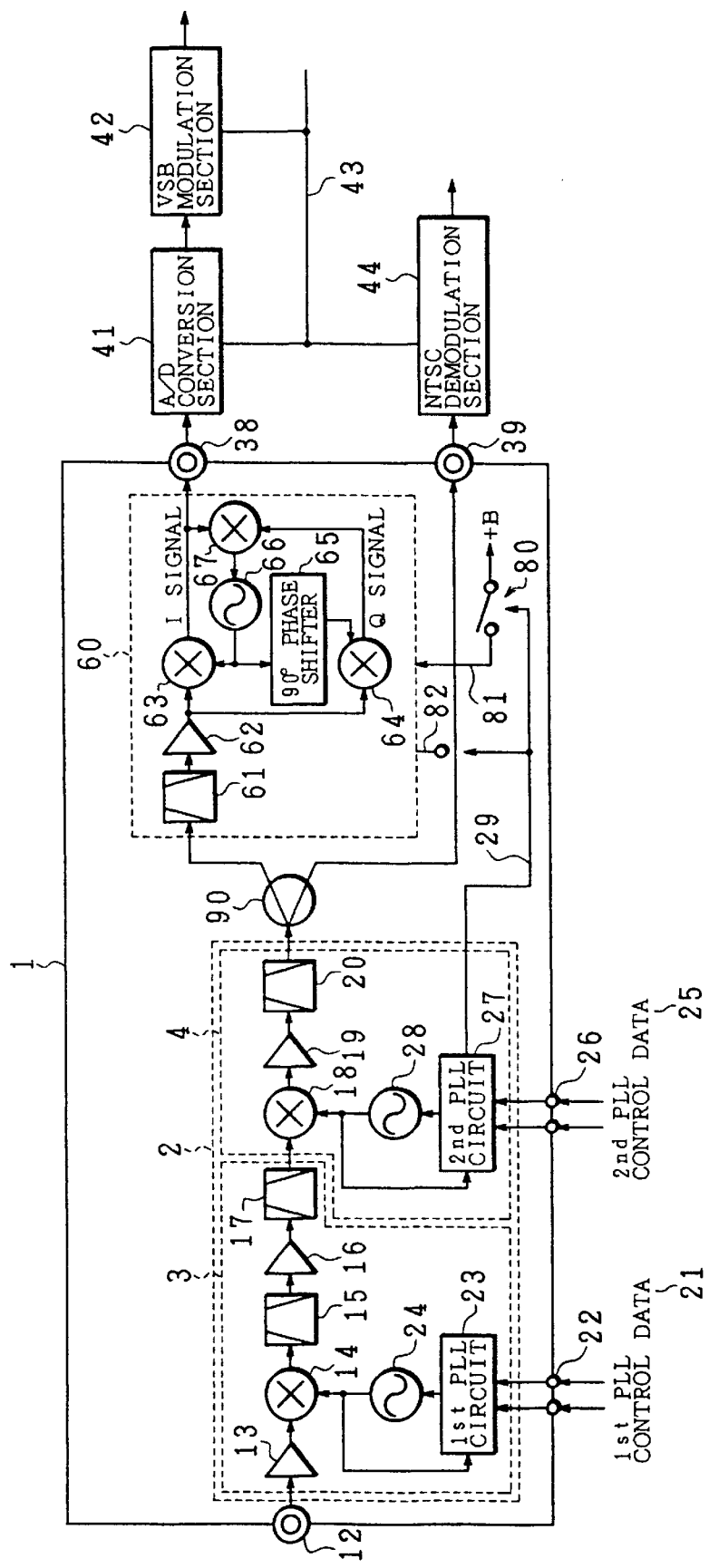
FIG. 8 is a block diagram schematically showing the structure of the foregoing tuner for digital and analog use, in which the foregoing down-converter section is replaced by a baseband demodulation section, and the structure of a front-end system for digital and analog use incorporating the foregoing tuner for digital and analog use.
Figure 9:
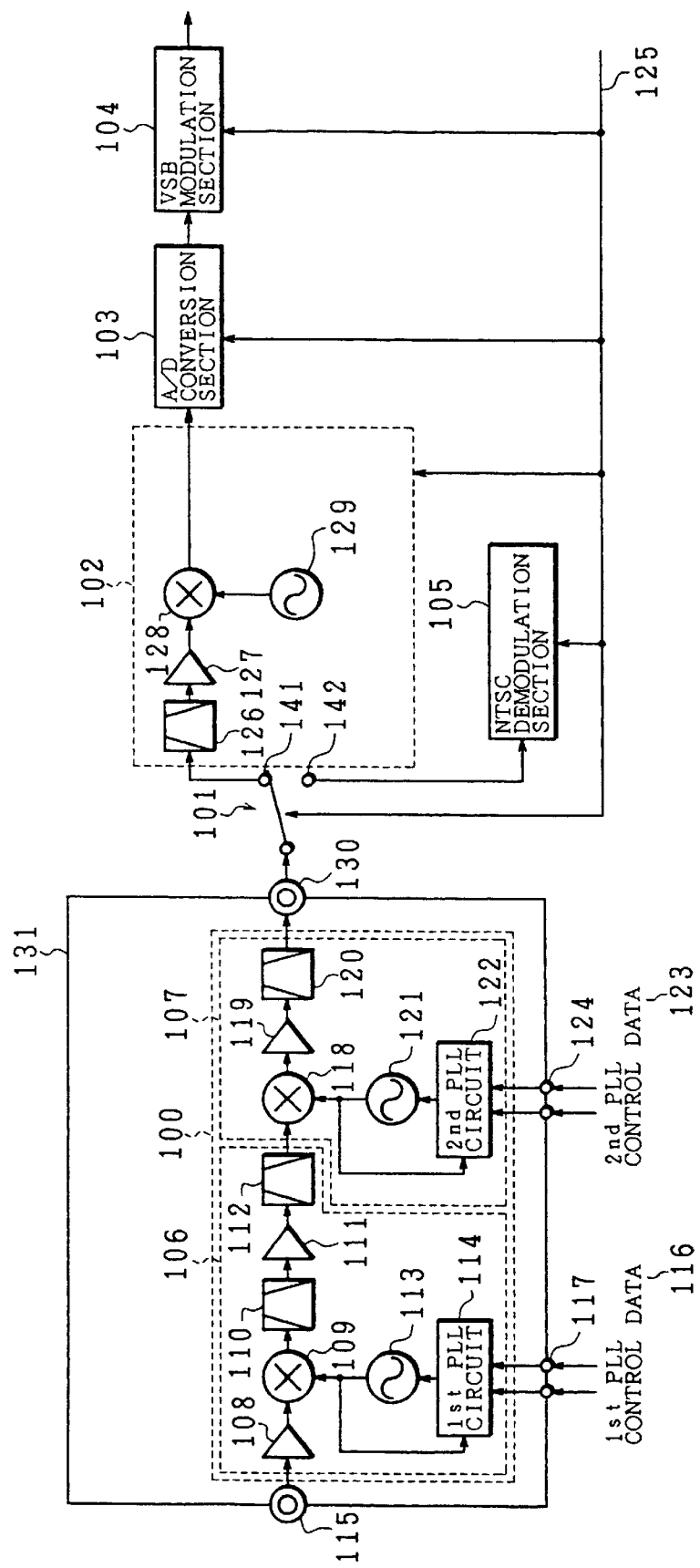
FIG. 9 is a block diagram schematically showing the structure of a conventional front-end system for digital and analog use, in which a tuner for digital and analog use and a down-converter section are separately provided.
Figure 10:
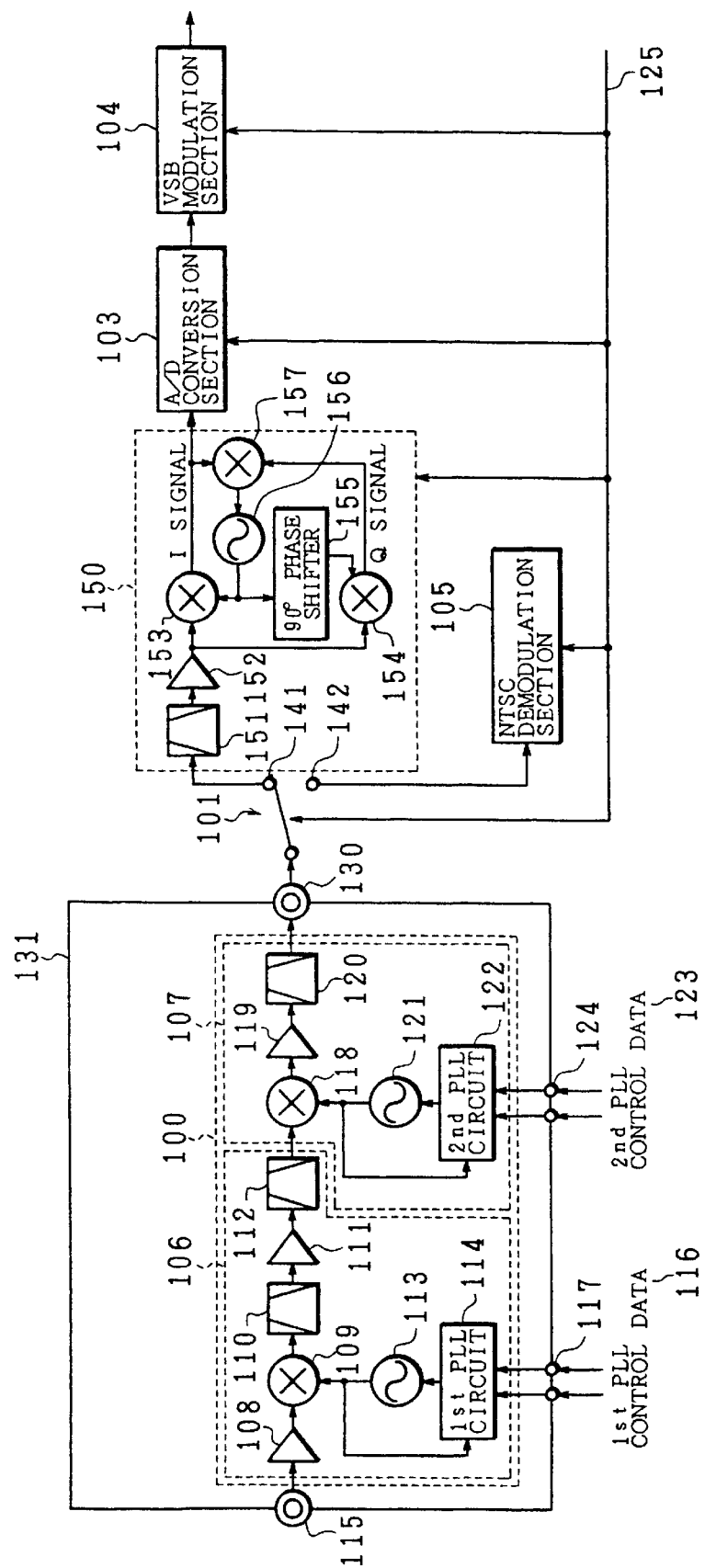
FIG. 10 is a block diagram schematically showing the structure of a conventional front-end system for digital and analog use, in which a tuner for digital and analog use and a baseband demodulation section are separately provided.

The following will explain a fourth embodiment of the present invention with reference to FIGS. 7 and 8. For ease of explanation, structural elements equivalent to those of any of the first through third embodiments above will be given the same reference numbers, and explanation thereof will be omitted here.

The tuner for digital and analog use according to the present embodiment is equivalent to that of the third embodiment above, except that, as shown in FIGS. 7 and 8, the switch section 70 shown in FIG. 5 is replaced by a distributor section 90.

In the third embodiment above, the switch section 70 is made up of semiconductors such as a diode, an FET (Field Effect Transistor), etc., and distortion arises when the IF signal passes through the semiconductors. However, since the distributor section 90 is made up of a distributor made of passive members such as a balun transformer, a resistance distributor, etc., distortion of the IF signal basically does not arise. Accordingly, with the structure according to the present embodiment, the problem with distortion of the IF signal at the switch section 70, which arises in the third embodiment, can be resolved.

Each of the foregoing embodiments explained tuners for digital and analog use which use the double-conversion method, but the present invention can also be applied to a tuner for digital and analog use which uses the single-conversion method. The single-conversion method uses a structure in which, in FIG. 1, for example, the frequency conversion section 2 is made up of only one conversion section (of only the first conversion section 3, for example, omitting the second conversion section 4), and the intermediate frequency used is, for example, 45.75 MHz.

As discussed above, one tuner for digital and analog use according to the present invention is a tuner for receiving both digital broadcast signals and analog broadcast signals. This toner includes: a signal input terminal; a frequency conversion section, which converts an inputted signal to an IF signal; a switching/distributing section, which, based on the type of received signal (analog/digital), switches a destination to which to send the IF signal or distributes the IF signal; a down-converter section, which further converts the IF signal into a Low IF signal; a terminal for output of the Low IF signal; and a terminal for output of the IF signal. The foregoing structural elements, i.e., signal input terminal, frequency conversion section, switching/distributing section, down-converter section, the terminal for output of Low IF signal, and terminal for output of the IF signal, are all contained in a single body which performs an electromagnetic seal function. Operation of the switching/distributing section and/or the down-converter section is controlled by a control signal from a structural element within the body.

With the foregoing structure, since the down-converter section is not influenced by noise produced by the digital processing system provided in the following stage, precision of the local oscillating frequency of the local oscillator of the down-converter section can be improved, and since unnecessary radiation produced by the down-converter section can be held to a minimum, during reception of an analog broadcasting signal, adverse effects of operation of the down-converter section on NTSC demodulation can be eliminated.

Additionally, in the foregoing tuner for digital and analog use, the foregoing switching/distributing section may be made of a switch section.

With the foregoing structure, by using a switch section for the switching/distributing section, complete switching of the destination of the IF signal can be performed.

Further, in the foregoing tuner for digital and analog use, a control voltage from a PLL circuit of the foregoing frequency conversion section may be used as a control signal from a structural element within the body, for controlling operation of the switching/distributing section and/or the down-converter section.

With the foregoing structure, since the down-converter section is not influenced by noise produced by the digital processing system provided in the following stage, precision of the local oscillating frequency of the local oscillator of the down-converter section can be improved.

Further, in the foregoing tuner for digital and analog use, during reception of an analog signal, shutoff of operation of the foregoing down-converter section may be performed by at least partially stopping power supply thereto.

With the foregoing structure, since unnecessary radiation produced by the down-converter section can be held to a minimum, during reception of an analog broadcasting signal, adverse effects of operation of the down-converter section on NTSC demodulation can be eliminated.

Further, in the foregoing tuner for digital and analog use, during reception of an analog signal, shutoff of operation of the foregoing down-converter section may be performed by supplying an OFF signal to an operation shutoff terminal thereof.

With the foregoing structure, some or all of the functions of the down-converter section can be stopped or placed in a waiting state, and thus obstruction of the NTSC demodulation section by the down-converter section can be held to a minimum.

Further, in the foregoing tuner for digital and analog use, the foregoing switching/distributing section may be made of a distributor section.

The foregoing structure is an especially effective alternative in cases when distortion of the IF signal at the switch section is a problem.

Another tuner for digital and analog use according to the present invention is a tuner for receiving both digital broadcast signals and analog broadcast signals. This tuner includes: a signal input terminal; a frequency conversion section, which converts an inputted signal to an IF signal; a switching/distributing section, which, based on the type of received signal (analog/digital), switches a destination to which to send the IF signal or distributes the IF signal; a baseband demodulation section, which baseband demodulates the IF signal into an I signal; a terminal for output of the I signal; and a terminal for output of the IF signal. The foregoing structural elements, i.e., the signal input terminal, frequency conversion section, switching/distributing section, baseband demodulation section, terminal for output of the I signal, and terminal for output of the IF signal, are all contained in a single body which performs an electromagnetic seal function. Operation of the switching/ distributing section and/or the baseband demodulation section is controlled by a control signal from a structural element within the body.

With the foregoing structure, since the baseband demodulation section is not influenced by noise produced by the digital processing system provided in the following stage, precision of the local oscillating frequency of the local oscillator of the baseband demodulation section can be improved, and since unnecessary radiation produced by the baseband demodulation section can be held to a minimum, during reception of an analog broadcasting signal, adverse effects of operation of the baseband demodulation section on NTSC demodulation can be eliminated.

Further, in the foregoing tuner for digital and analog use, the foregoing switching/distributing section may be made of a switch section.

With the foregoing structure, by using a switch section for the switching/distributing section, complete switching of the destination of the IF signal can be performed.

Further, in the foregoing tuner for digital and analog use, a control voltage from a PLL circuit of the foregoing frequency conversion section may be used as a control signal from a structural element within the body, for controlling operation of the switching/distributing section and/ or the baseband demodulation section.

With the foregoing structure, since the baseband demodulation section is not influenced by noise produced by the digital processing system provided in the following stage, precision of the local oscillating frequency of the local oscillator of the baseband demodulation section can be improved.

Further, in the foregoing tuner for digital and analog use, during reception of an analog signal, shutoff of operation of the foregoing baseband demodulation section may be performed by at least partially stopping power supply thereto.

With the foregoing structure, since unnecessary radiation produced by the baseband demodulation section can be held to a minimum, during reception of an analog broadcasting signal, adverse effects of operation of the baseband demodulation section on NTSC demodulation can be eliminated.

Further, in the foregoing tuner for digital and analog use, during reception of an analog signal, shutoff of operation of the foregoing baseband demodulation section may be performed by supplying an OFF signal to an operation shutoff terminal thereof.

With the foregoing structure, some or all of the functions of the baseband demodulation section can be stopped or placed in a waiting state, and thus obstruction of the NTSC demodulation section by the baseband demodulation section can be held to a minimum.

Further, in the foregoing tuner for digital and analog use, the foregoing switching/distributing section may be made of a distributor section.

The foregoing structure is an especially effective alternative in cases when distortion of the IF signal at the switch section is a problem.

Incidentally, another possible structure for the signal conversion means is a circuit block having the functions of limiting the signal to a necessary digital band and adjusting it to a level required for A/D conversion.

The embodiments and concrete examples of implementation discussed in the foregoing detailed explanation of the present invention serve solely to illustrate the technical contents of the present invention, which should not be narrowly interpreted within the limits of such concrete examples, but rather may be applied in many variations without departing from the spirit of the present invention and the scope of the patent claims set forth below.

What is claimed is:

1. A tuner for digital and analog use which is capable of receiving both digital broadcast and analog broadcast signals, comprising:

frequency conversion means, which convert a received signal to an intermediate-frequency signal;

destination determining means, which determine a destination to which to send the intermediate-frequency signal from said frequency conversion means;

signal conversion means, which convert the intermediate-frequency signal obtained through said destination determining means to a signal suitable for input to an external digital processing system;

a body, which contains said frequency conversion means, said destination determining means, and said signal conversion means, with said digital processing system being external to the body;

an input terminal, into which both digital broadcast and analog broadcast signals are inputted; and output terminals which separately output, to the exterior of the tuner, respective intermediate-frequency signals corresponding to a digital broadcast signal and to an analog broadcast signal, wherein said input and output terminals are provided in said body.

2. The tuner of claim 1, wherein said body has an electromagnetic seal effect.

3. The tuner of claim 1, wherein said destination determining means includes a switch section that switches the destination to which to send the intermediate-frequency signal based on the type of signal received.

4. The tuner of claim 1, wherein said destination determining means includes a distributor section that distributes and sends the intermediate-frequency signal.

5. The tuner of claim 1, wherein said signal conversion means includes a down-converter section that down-converts the intermediate-frequency signal obtained via said destination determining means to a low-frequency signal.

6. The tuner of claim 1, wherein said signal conversion means includes a baseband demodulation section that baseband demodulates the intermediate-frequency signal obtained via said destination determining means.

7. A tuner for digital and analog use which is capable of receiving both digital broadcast and analog broadcast signals, comprising:

frequency conversion means, which convert a received signal to an intermediate-frequency signal;

destination determining means, which determine a destination to which to send the intermediate-frequency signal from said frequency conversion means;

signal conversion means, which convert the intermediate-frequency signal obtained through said destination determining means to a signal suitable for input to an external digital processing system;

a body, which contains said frequency conversion means, said destination determining means, and said signal conversion means;

an input terminal, into which both digital broadcast and analog broadcast signals are inputted; and output terminals which separately output, to the exterior of the tuner, respective intermediate-frequency signals corresponding to a digital broadcast signal and to an analog broadcast signal, wherein said input and output terminals are provided in said body, wherein operation of said signal conversion means is controlled based on a control signal from said frequency conversion means.

8. The tuner of claim 7, wherein said frequency conversion means include a PLL circuit, and wherein the control signal is a control voltage from said PLL circuit.

9. The tuner of claim 7, further comprising:

a power supply control section, which controls power supply to said signal conversion means based on said control signal, wherein said power supply control section at least partially stops providing power to said signal conversion means during reception of an analog broadcast signal, thereby stopping operation of said signal conversion means.

10. A tuner for digital and analog use which is capable of receiving both digital broadcast and analog broadcast signals, comprising:

frequency conversion means, which convert a received signal to an intermediate-frequency signal;

destination determining means, which determine a destination to which to send the intermediate-frequency signal from said frequency conversion means;

signal conversion means, which convert the intermediate-frequency signal obtained through said destination determining means to a signal suitable for input to an external digital processing system;

a body, which contains said frequency conversion means, said destination determining means, and said signal conversion means;

an input terminal, into which both digital broadcast and analog broadcast signals are inputted; and output terminals which separately output, to the exterior of the tuner, respective intermediate-frequency signals corresponding to a digital broadcast signal and to an analog broadcast signal, wherein said input and output terminals are provided in said body, wherein switching operations of said switch section are controlled based on a control signal from said frequency conversion means.

11. The tuner of claim 10, wherein said frequency conversion means include a PLL circuit, and wherein the control signal is a control voltage from said PLL circuit.

12. A tuner for digital and analog use which is capable of receiving both digital broadcast and analog broadcast signals, comprising:

frequency conversion means, which convert a received signal to an intermediate-frequency signal;

destination determining means, which determine a destination to which to send the intermediate-frequency signal from said frequency conversion means;

signal conversion means, which convert the intermediate-frequency signal obtained through said destination determining means to a signal suitable for input to an external digital processing system; and a body, which contains said frequency conversion means, said destination determining means, and said signal conversion means, wherein operation of said signal conversion means is controlled based on a control signal from said frequency conversion means, wherein said signal conversion means include an operation shutoff terminal, to which is inputted an operation shutoff signal, and wherein said frequency conversion means provide the operation shutoff signal to said operation shutoff terminal during reception of an analog broadcast signal, so as to stop operation of said signal conversion means.

13. A front end for digital and analog use, comprising:

a tuner that further comprises frequency conversion means, which convert a received signal to an intermediate-frequency signal;

destination determining means, which determine a destination to which to send the intermediate-frequency signal from said frequency conversion means;

signal conversion means, which convert the intermediate-frequency signal obtained through said destination determining means to a signal suitable for input to an external digital processing system;

a body, which contains said frequency conversion means, said destination determining means, and said signal conversion means, with the digital processing system being external to the body;

an input terminal, into which both digital broadcast and analog signals are inputted; and output terminals which separately output, to the exterior of the tuner, respective intermediate-frequency signals corresponding to a digital broadcast signal and to an analog broadcast signal, wherein said input and output terminals are provided in said body, and a demodulation section that performs both digital demodulation processing and analog demodulation processing of signals sent from said tuner.

14. The front end of claim 13; wherein operations of said demodulation section are controlled by a control signal that differs from a control signal which is inputted into said signal conversion means.

15. A tuner for digital and analog use which is capable of receiving both digital broadcast and analog broadcast signals, comprising:

frequency conversion means, which convert a received signal to an intermediate-frequency signal;

destination determining means, which determine a destination to which to send the intermediate-frequency signal from said frequency conversion means;

signal conversion means, which convert the intermediate-frequency signal obtained through said destination determining means to a signal suitable for input to an external digital processing system;

a body, which contains said frequency conversion means, said destination determining means, and said signal conversion means;

an input terminal, into which both digital broadcast and analog broadcast signals are inputted; and output terminals which separately output, to the exterior of the tuner, respective intermediate-frequency signals corresponding to a digital broadcast signal and to an analog broadcast signal, wherein said input and output terminals are provided in said body, wherein control of operations of the signal conversion means and the destination determining means is carried out according to a control signal fed from the frequency conversion means.

16. A tuner for digital and analog use which is capable of receiving both digital broadcast and analog broadcast signals, comprising:

frequency conversion means, which convert a received signal to an intermediate-frequency signal;

destination determining means, which determine a destination to which to send the intermediate-frequency signal from said frequency conversion means;

signal conversion means, which convert the intermediate-frequency signal obtained through said destination determining means to a signal suitable for input to an external digital processing system;

a body, which contains said frequency conversion means, said destination determining means, and said signal conversion means;

an input terminal, into which both digital broadcast and analog broadcast signals are inputted; and output terminals which separately output, to the exterior of the tuner, respective intermediate-frequency signals corresponding to a digital broadcast signal and to an analog broadcast signal, wherein said input and output terminals are provided in said body, wherein in the case where said destination determining means is composed only of a switch section, control of an operation of the switch section is only carried out according to the control signal fed from the frequency conversion means.

* * * * *